Nov. 7, 1967 J. A. NARUD ET AL 3,351,782

MULTIPLE EMITTER TRANSISTORIZED LOGIC CIRCUITRY

Original Filed July 25, 1963

2 Sheets-Sheet 1

INVENTORS:
Jan A. Narud
Walter C. Seelbach
By Mueller & Aichele
Attorney

INVENTORS:
Jan A. Narud
Walter C. Seelbach
By Mueller & Aichele
Attorney 3,351,782
Patented Nov. 7, 1967

3,351,782

MULTIPLE EMITTER TRANSISTORIZED LOGIC CIRCUITRY

Jan A. Narud and Walter C. Seelbach, Scottsdale, Ariz., assignors to Motorola, Inc., Chicago, Ill., a corporation of Illinois Continuation of application Ser. No. 297,610, July 25, 1963. This application Apr. 1, 1965, Ser. No. 446,781
10 Claims. (Cl. 307—88.5)

ABSTRACT OF THE DISCLOSURE

Logic circuitry including a first transistor having an output electrode and input electrode and a plurality of common electrodes, and a plurality of degenerative feedback impedances connected, respectively, to the common electrodes. A plurality of input transistors are connected, respectively, to the plurality of degenerative feedback impedances and are adapted to receive binary input logic signals which drive the input transistors into conduction, causing current to flow in the degenerative feedback impedances. Such current flow develops a voltage across the feedback impedances capable of changing the conductive state of the first transistor. An emitter follower transistor is connected to the output electrode of the first ransistor for providing an output logic signal in response to a predetermined signal condition of the binary input logic signals applied to the input transistors.

Figure 1:
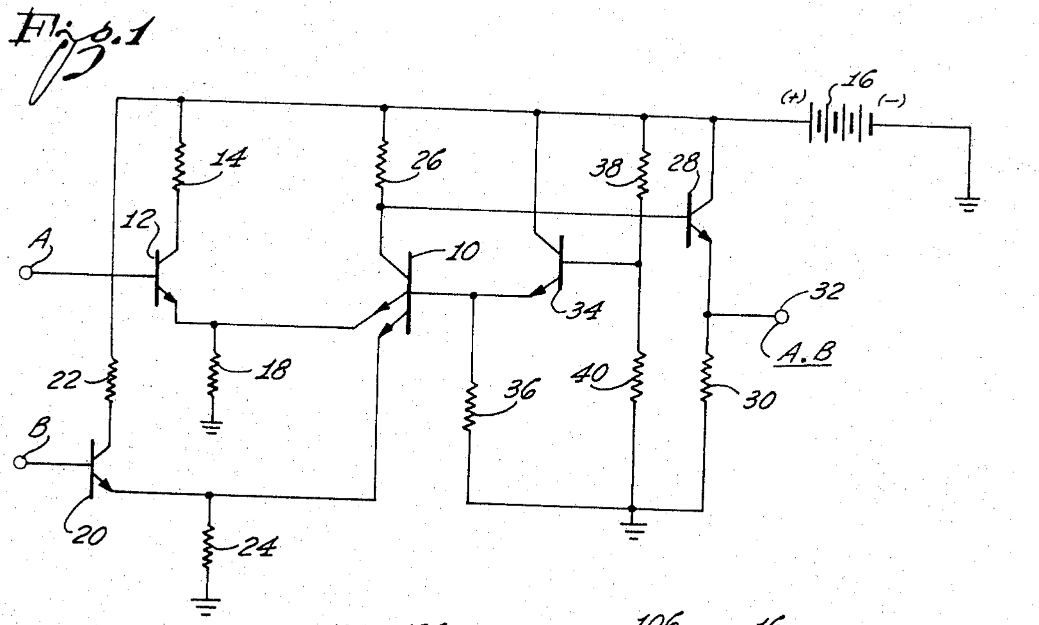

This application is a continuation of application Ser. No. 297,610, filed July 25, 1963, now abandoned.

The present invention relates to logic circuitry for use in computers, and the like; and its relates more particularly to improved logic circuitry and systems which are particularly suited to integrated circuit construction.

The use of integrated circuit techniques in the fabrication of computer logic circuitry has become increasingly prevalent in recent years. The integrated circuit, as is known, comprises a substrate of a suitable semiconductor material of a particular conductivity type. In accordance with the integrated circuit methods and techniques, diffused p-n junctions are formed in the substrate, and these constitute transistors, diodes, and the like.

Copending application Ser. No. 273,033 filed Apr. 15, 1963, in the name of the present inventors, and assigned to the present assignee, discloses and claims improved logic circuitry which is conceived to iscorporate a transistorized current mode switching circuit and is particularly constructed to utilize the inherent advantages of integrated circuit construction. The logic circuitry of the copending case is particularly constructed to compensate for any instability in the characteristics of integrated circuitry.

The present invention is, likewise, concerned with the same general type of logic circuitry as described in the copending case, and which is particularly adapted to integrated circuit construction. The logic circuitry to be described likewise uses the current mode switching circuit described in the copending application.

As pointed out in the copending application, certain limitations are encountered when it is attempted to construct logic circuitry in accordance with integrated circuit techniques. One such limitation is due to the parasitic coupling between various parts of the circuits through neighboring regions and through the substrate itself. Such parasitic coupling tends to reduce the operational speed of the integrated circuit, particularly if the impedance at the points where logical connections are made is relatively high.

As also pointed out in the copending application, it has been found that integrated circuits are relatively sensitive to variations in the values of the components with changes in ambient conditions. This is because the characteristics of the semiconductor components vary, for example, exponentially with temperature. Therefore, the transfer characteristics of an integrated circuit is susceptible to material change with temperature. Therefore, if such circuits are to be used in applications requiring characteristic stability, some form of compensation must be provided.

A further limitation in the use of integrated circuits is that the connections which furnish power to the circuit are usually miniaturized. This means that the power connections exhibit relatively high resistance, and this tends to poor voltage regulation in the system. It is necessary, therefore, for stability in the operating characteristics, that the integrated circuit be constructed so that its operating characteristics are unaffected in the presence of variations in the exciting voltage.

An object of the present invention, like that of the copending application, is to provide improved transistorized logic circuitry, which is particularly suited to fabrication as an integrated circuit unit, and which is reliable in its operation, and is relatively insensitive to variations due to ambient and environmental changes, or aging effects.

The present invention, however, is particularly concerned with the use of multiple emitter transistors in logic circuitry of the general type disclosed and claimed in the copending application. The integrated circuit lends itself particularly well to the formation of multiple emitter transistors, and such transistors are used in the logic circuitry of the present invention to provide the different logic functions required in a computer.

The multiple emitter transistor can be made to perform the "and" function in its collector with respect to different signals applied to its respective emitters. This is a significant feature which is conveniently used in the logic circuitry to be described, and which obviates the need for a multiplicity and complexity of extraneous components and circuitry.

The multiple emitter logic circuitry to be described is particularly advantageous in that it is capable of utilizing the inherent advantages of integrated circuit construction and of compensating for the inherent disadvantages normally encountered in such circuits.

A further object of the invention, therefore, is to provide improved transistor logic circuitry which is particularly susceptible to integrated circuit construction and which is capable of performing relatively complex logic functions with a minimum of components and circuit connections.

A further object of the invention is to provide such improved transistorized logic circuitry which exhibits a high degree of flexibility in its capabilities of performing different logic functions.

A feature of the invention is the provision of an integrated circuit which is capable of performing a logical function and which incorporates a multiple emitter transistor; the multiple emitters of the transistor performing a sum function, and the "and" function being performed by the collector of the transistor by the use of the multiple emitters.

Another feature of the invention is the provision of such an improved logic circuit which may include a plurality of additional transistors connected in circuit with each of the emitters of the multiple emitter transistor so as to perform the "or" functions at the common emitter node.

A further feature is the provision of such an improved logic circuitry which may conveniently be connected as a "half-added," "majority gate," or other type of presently utilized logic circuit.

Another feature of the invention is the provision of an emitter follower in the output circuit to achieve a desired characteristic of like voltage deviation in the output and input circuits and also of achieving the desired characteristic of a low output impedance.

Yet another feature of the invention is the provision of such an improved logic circuit which incorporates a multiple emitter transistor, and which includes degenerative feedback means so that the tolerance requirements of the components of the circuit may be relatively low.

Yet another feature of the invention is the provision of such an improved multiple emitter transistorized type of logic circuit which includes regulating means in the system to render the system relatively independent of variations in the power supply voltage.

Figure 3:
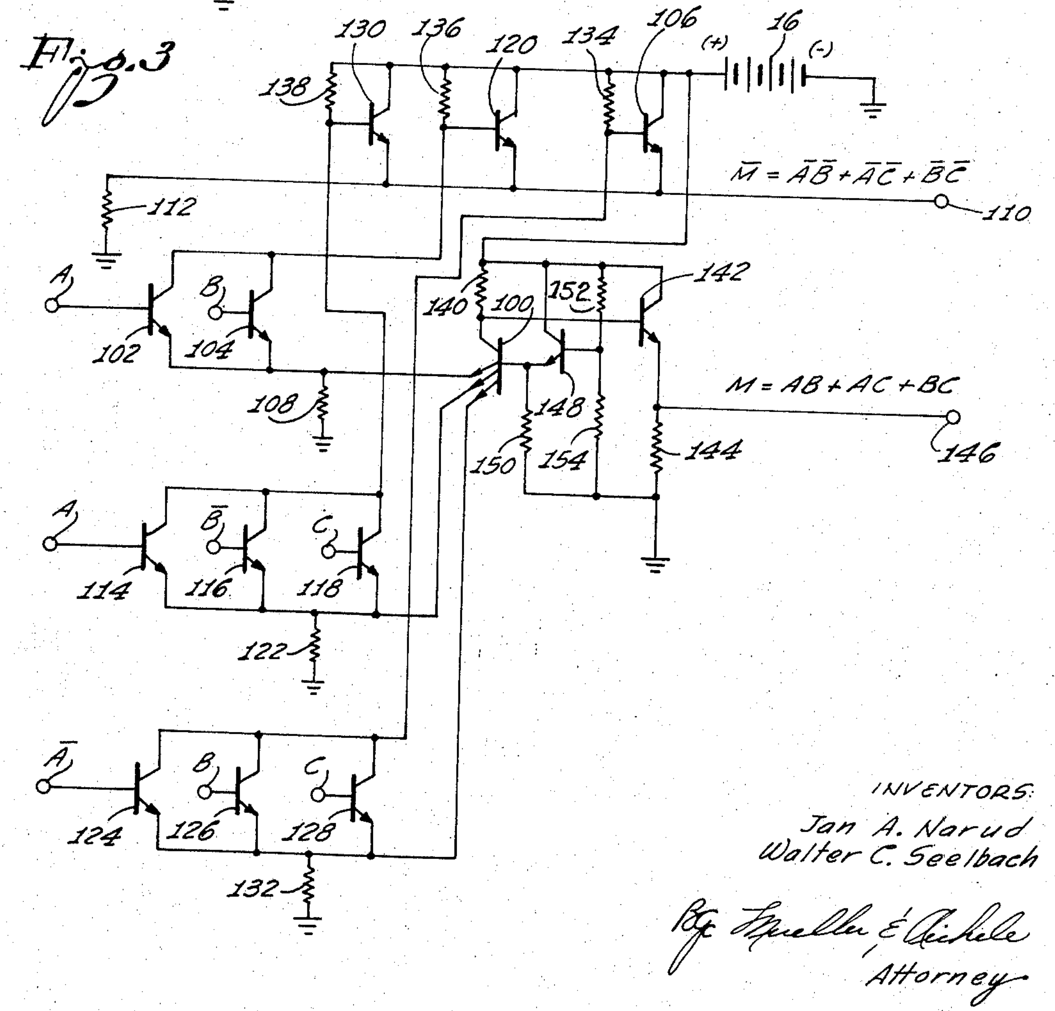
Figure 2:
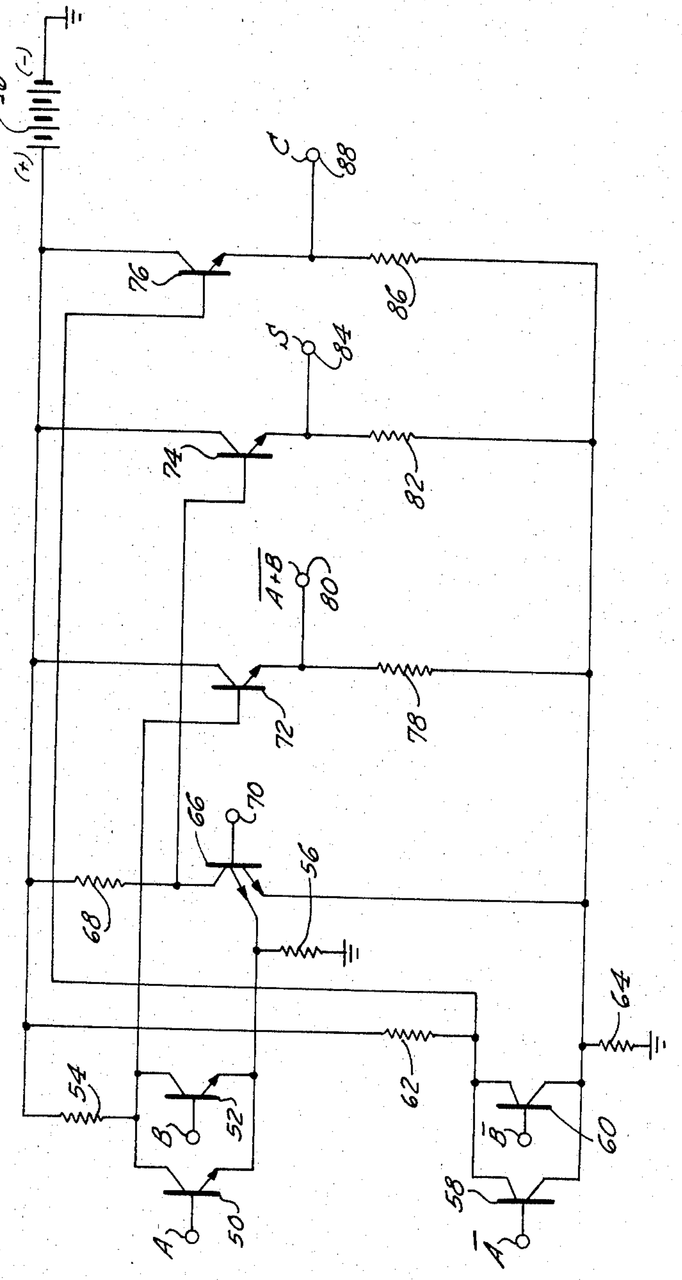

Other features, advantages and objects of the invention will become apparent from a consideration of the following description, when the description is taken in conjunction with the accompanying drawings, in which:

FIGURE 1 is a transistorized logic "and" gate circuit constructed to incorporate a multiple emitter transistor in accordance with the concepts of the invention;

FIGURE 2 is a logic circuit which is particularly suited to perform a half adder function and which also incorporates a multiple emitter transistor; and FIGURE 3 is a transistorized logic circuit of the "majority gate" type, constructed to incorporate a multiple emitter transistor in accordance with the concepts of the invention; and which is particularly adapted to integrated circuit construction.

As mentioned above, the integration of logic circuitry imposes some additional requirements to the technology involved. First, there is a tendency towards parasitic coupling between the various parts of the circuit through neighboring regions and through the substrates. In addition, certain ranges of component values cannot be readily attained by present day integrated circuit techniques. Furthermore, because the components cannot be individually selected in an integrated circuit, the individual component parameters must necessarily have much larger tolerances than their counterparts in the usual types of prior art circuit.

The construction of integrated logic circuitry is, therefore, much more difficult than the design of the corresponding circuit using discrete components. As noted above, the principal object of the invention described in the copending application is to overcome and counteract such difficulties, and the principal object of the present invention is to overcome the difficulties inherent in the integrated type of circuit, as applied to the use of multiple emitter transistors in such circuits.

For example, in the multiple emitter transistor type of integrated circuit to be described, the logical connections are made at points which have a low impedance level with respect to ground so as to counteract the effect of parasitic coupling to the substrate. The multiple emitter transistor type of logic circuitry to be described also incorporates degenerative feedback so that large tolerance limits are possible for the integrated components of the circuit.

The multiple emitter transistor type of logic circuitry to be described also incorporates compensation means to overcome the effects of variations in power supply voltages, temperatures, and other external effects.

The logic circuit of FIGURE 1 includes a multiple emitter transistor 10. The illustrated transistor is of the NPN type. It includes a base electrode, a collector electrode, and in the illustrated embodiment, it includes two emitter electrodes. The multiple emitter transistor 10 may be formed in accordance with known integrated circuit techniques.

The circuit of FIGURE 1 includes a first input circuit which, in turn, includes an NPN transistor 12. The collector of the transistor 12 is connected through a resistor 14 to the positive terminal of a unidirectional potential source 16, the negative terminal of the source being connected to a point of reference potential, such as ground. The emitter of the transistor 12 is connected to a grounded degenerative feedback resistor 18 and to the first emitter of the transistor 10.

The circuit of FIGURE 1 also includes a second input circuit which, in turn, includes a transistor 20. This latter transistor is also of the NPN type in the particular illustrated embodiment. The collector of the transistor 20 is connected to the positive terminal of the source 16 through a resistor 22. The emitter of the transistor 20 is connected to a grounded degenerative feedback resistor 24 and to the second emitter of the transistor 10.

The collector of the transistor 10 is connected through a resistor 26 to the positive terminal of the source 16. The collector of the transistor 10 is also connected to the base electrode of an emitter follower NPN transistor 28. The collector of the transistor 28 is connected to the positive terminal of the source 16, and its emitter is connected to a grounded resistor 30 and to an output terminal 32.

A further bias stabilizing NPN transistor 34 is provided, the emitter of which is connected to the base of the transistor 10 and to a grounded resistor 36. A pair of resistors 38 and 40 are connected as a voltage divider across the source 16. The common junction of these resistors is connected to the base electrode of the bias stabilizing transistor 34.

In the circuit of FIGURE 1, an input A is applied to the base electrode of the transistor 12, and an input B is applied to the base electrode of the transistor 20. The multiple emitters of the transistor 10 performs a "sum" function. These emitters of the transistor 10 and the transistors 12 and 20 are connected as a current mode switching circuit. When both the inputs A and B are true, the switch operates to render the transistor 10 conductive. Only for such a condition does an output appear at the collector of the transistor 10, so that the circuit performs an "and" function. The output from the transistor 10 is applied to the base of the emitter follower transistor 28, so that an output appears at the output terminal 32 under certain input conditions. The circuit of FIGURE 1 functions as an "and" gate so that the output is $A \cdot B$.

The input signals applied to the input terminals are each in the form of voltage transitions between two voltage levels, as described in the aforementioned copending application. So long as any one of the input signals is in its lower voltage condition, the transistor 10 is conductive. When the transistor 10 is conductive, its collector potential is negative with respect to the potential of the potential of the positive terminal of the source 16.

On the other hand, when an input signal is at its high voltage level, the corresponding input transistor is conductive, so that a voltage is produced across the resistor 18 or 24. This voltage cuts off the current through the corresponding emitter of the transistor 10. Therefore, when both the inputs are at this high voltage level, the transistor 10 is rendered non-conductive and the potential of its collector approaches the positive potential of the source 16.

The emitter follower transistor 28 serves to translate the voltage at the collector of the transistor 10 from a relatively high voltage to a lower voltage level. The limits of the lower voltage level are approximately the same as the upper and lower voltage swings of the inputs. This permits the output terminal to be connected directly to the input terminal of a succeeding like stage without the need for intermediate transposing stages.

The inclusion of the transistor 34 and its associated circuitry provides regulation for the circuit of FIGURE 1. Transistor 34 applies a voltage to the base of transistor 10 which controls the threshold or operating point for the switching action. This transistor responds to variations in the voltage of source 16 to shift the operating point of the transistor 10 in a compensating direction.

Transistor 34 is of the same type as transistor 10 and compensates the threshold voltage for changes in characteristics of transistor 10 with temperature.

The half-adder logic circuit of FIGURE 2, in addition to providing the regular sum ($s$) and carry ($c$) output, also has a "nor" output. The inputs to the half-adder circuit of FIGURE 2 are designated A, $\overline{A}$, and B, $\overline{B}$. These inputs are applied to corresponding designated input terminals.

The input terminals A and B are connected to the base electrodes of respective NPN transistors 50 and 52. The collectors of the transistors 50 and 52 are connected to a common resistor 54, which, in turn, is connected to the positive terminal of the voltage source 16. The emitters of the transistors 50 and 52 are connected to a common emitter resistor 56 which, in turn, is grounded.

The input terminal $\overline{A}$ is connected to the base of a transistor 58, and the input treminal $\overline{B}$ is connected to an NPN transistor 60. The collectors of the transistors 58 and 60 are connected to a common resistor 62 which, in turn, is connected to the positive terminal of the source 16. The emitters of the transistors 58 and 69 are connected to a grounded resistor 64.

The common emitters of the transistors 50 and 52, and the common emitters of the transistors 58 and 60, are connected to respective emitters of a double emitter NPN transistor 66. The collector of the transistor 66 is connected to a resistor 68 which, in turn, is connected to the positive terminal of the source 16. A regulator circuit, such as the circuit of the transistor 34 in FIGURE 1, is connected to the terminal 70 which, in turn, is connected to the base of the double emitter transistor 66.

The collectors of the transistors 50 and 52 are connected to the base of an emitter follower transistor 72. The collector of the transistor 66 is connected to the base of an NPN emitter follower transistor 74, and the common collectors of the transistors 58 and 60 are connected to the base of an NPN emitter follower transistor 76. The collectors of the emitter follower transistors 72, 74 and 76 are directly connected to the positive terminal of the source 16. The emitter of the transistor 72 is connected to a resistor 78 and to an output terminal 80. The emitter of the transistor 74 is connected to a resistor 82 and to an output terminal 84. The emitter of the transistor 76 is connected to a resistor 86 and to an output terminal 88.

In a manner similar to that described above in conjunction with FIGURE 1, the half-adder circuit of FIGURE 2 provides the regular sum output ($s$) at the output terminal 84. In addition, the circuit of FIGURE 2 provides the carry output ($c$) at the output terminal 88. The half-adder circuit of FIGURE 2 is constructed so that it additionally provides a "nor" output $(\overline{\overline{A}+\overline{B}})$ at the output terminal 80.

It should be noted that the "or" function can also be performed in the circuit of FIGURE 2 by connecting the emitter followers 72, 74 and 76 together. Also, if one connects the emitter followers 72 and 76 together, the half-adder will generate the complement of the sum in addition to the sum. This provides a high degree of logic flexibility in the circuit.

The logic circuitry of FIGURE 3 is of the type commonly referred to as a "majority gate." In this circuit, the output is true when a majority of the inputs are true. This type of circuit finds utility in the arithmetic section of a computer. The circuit of FIGURE 3 includes a multiple emitter transistor 100. The illustrated transistor is of the NPN type, and it includes a base electrode, a collector electrode, and in the illustrated embodiment, it includes three emitter electrodes. The multiple emitter transistor 100 may be formed in accordance with known integrated circuit techniques, as may the additional components of the circuit to be described.

The logic circuitry of FIGURE 3 is similar in some respects to the circuit of FIGURE 2 and includes a first input circuit which, in turn, includes a pair of NPN transistors 102 and 104. The collectors of the transistors 102 and 104 are connected to the base of an NPN transistor 120, the collector of which is connected to the positive terminal of the unidirectional potential source 16, the negative terminal of the source being connected to a point of reference potential, such as ground. The emitters of the transistors 102 and 104 are connected to a grounded degenerative feedback resistor 108, and to the first emitter of the multiple emitter transistor 100. The emitter of the transistor 120 is connected to an output terminal 110 and to a grounded resistor 112. The resistor 108 may have resistance of 1.24 kilo-ohms, and the resistor 112 may have a resistance of 2 kilo-ohms.

The logic circuitry of FIGURE 3 also includes a second input circuit which, in turn, includes three transistors 114, 116 and 118. These latter transistors are also of the NPN type. The collectors of the transistors 114, 116 and 118 are connected to the base of an NPN transistor 130, the collector of which is connected to the positive terminal of the source 16. The emitters of the transistors 114, 116 and 118 are connected to a grounded degenerative feedback resistor 122 and to the second emitter of the transistor 100. The emitter of the transistor 130 is connected to the resistor 112. The resistor 122 may have a resistance of 1.24 kilo-ohms.

A third input circuit is also provided in the circuitry of FIGURE 3, and this latter circuit includes three NPN transistors 124, 126 and 128. The collectors of the latter transistors are all connected to the emitter of an NPN transistor 106, the collector of which is connected to the positive terminal of the source 16. The emitters of the transistors are connected to a grounded degenerative feedback resistor 132 and to the third emitter of the transistor 100. The emitter of the transistor 106 is connected to the resistor 112. The resistor 132 may have a resistance of 1.24 kilo-ohms. The base electrodes of the transistors 106, 120 and 130 are connected to the positive terminal of the source 16 through respective resistors 134, 136 and 138, each of which may have a resistance of 300 ohms.

The collector of the transistor 100 is connected to a resistor 140 which, in turn, is connected to the positive terminal of the source 16. This resistor may have a resistance of 300 ohms. The collector of the transistor 100 is also connected to the base electrode of a further NPN transistor 142. The transistor 142 is connected as an emitter follower. The collector of the transistor 142 is connected to the positive terminal of the source 16, and its emitter is connected to a grounded resistor 144 and to an output terminal 146. The resistor 144 may have a resistance of 2 kilo-ohms.

A further NPN transistor 148 is provided, the emitter of which is connected to the base of the transistor 100 and to a grounded resistor 150. The collector of the transistor 148 is connected to the positive terminal of the source 16. A pair of resistors 152 and 154 are connected as a voltage divider across the source 16. The common junction of the resistors 152 and 154 is connected to the base of the transistor 148.

In the circuit of FIGURE 3, three separate inputs are applied to the base electrodes of the different input transistors, and the complements of certain of the inputs are also applied to the base electrodes of others of the input transistors. For example, the inputs A and B are applied respectively to the base electrodes of the transistors 102 and 104; the inputs A, $\overline{B}$ and C are respectively applied to the base electrodes of the transistors 114, 116 and 118; and the inputs $\overline{A}$, B and C are applied respectively to the base electrodes of the transistors 124, 126 and 128.

The transistors 102 and 104 are connected as an "or" gate, and a corresponding output appears across the resistor 108 when either the terms A or B is true. Likewise, the transistors 114, 116 and 118 are connected as an "or" gate, and a signal appears across the resistor 122 when any one of the terms A, $\overline{B}$ or C is true. Likewise, the transistors 124, 126 and 128 are connected as an "or" gate, and an output appears across the resistor 132 whenever any one of the terms $\overline{A}$, B or C is true.

As mentioned above, the multiple emitters of the transistor 100 perform a "sum" function. That is, an "and" function is performed in the collector of the transistor 100 by the use of multiple emitters, while the "or" functions are performed at the common emitter node, as mentioned above.

The output from the transistor 100 is applied to the base of the emitter follower transistor 142, so that under certain input conditions an output appears at the output terminal 146. In the particular embodiment described above, the logic circuitry of FIGURE 3 functions to perform a majority gate logic function. That is, the output term $M=AB+BC+AC$ appears at the output terminal 146. At the same time, the complement output term $\overline{M}=\overline{AB}+\overline{BC}+\overline{AC}$ appears at the output terminal 110. In a majority logic gate, the output is true if the majority of the input terms are true. This type of logic has wide application, as mentioned above. For instance, the illustrated logic is particularly useful in the arithmetic section of a computer, as mentioned above; and it is also useful in many types of data processing systems.

It is to be noted that the circuitry of FIGURE 3 provides three "and" functions in a single transistor circuit. It is obvious that the circuit of FIGURE 3 has wide application wherever a multiple of "and" functions are to be provided with a minimum of required circuitry. The $\overline{B}$ and $\overline{A}$ terms are used in the input to avoid saturation under conditions where all three terms A, B and C are false.

The input signals applied to the input terminals are each in the form of voltage transitions between two voltage levels. The base of the transistor 100 is biased by the circuitry of the transistor 148 to a level which is about halfway between the upper and lower voltage levels of the input signals. Therefore, when any one of the input signals applied respectively to the emitters of the transistor 100 is at its lower voltage condition, the base of the transistor 100 is positive with respect at least to one of the emitters, so that the transistor 100 is conductive.

The transistor 100 is conductive, therefore, when any one of its emitters is so established at the lower voltage condition. It follows, therefore, that if all of the input signals applied to the different input terminals of any one input circuit are in their lower voltage condition, the transistor 100 is conductive. When the transistor 100 is conductive, its collector potential is negative with respect to the potential of the positive terminal of the source 16.

On the other hand, when an input signal is at its high voltage level, the corresponding input transistor is rendered conductive, so as to produce a voltage across the corresponding resistors 108, 122 or 132. This voltage causes the current through the corresponding emitter of the transistor 100 to be terminated. Therefore, when any one of the inputs in all three of the input circuits is at its high voltage level, the transistor 100 is rendered non-conductive, so that the potential of its collector approaches the positive potential of the source 16.

The potential appearing at the collector of the transistor 100 is applied to the base of the emitter follower transistor 142, so that the output signal at the output terminal 146 is in phase opposition with the input signal.

The emitter follower transistor 142 serves to translate the voltage appearing at the collector of the transistor 100 from a relatively high voltage level to a lower voltage level, the limits of the latter voltage level being approximately the same as the upper and lower voltage swings of the input signals applied to the different input terminals. This transformation enables the output terminal 146 to be connected directly to the input terminal of a succeeding like stage without any necessity for transposing the reference axis of the output signal.

As noted above, the output signal which appears at the output terminal 146 has substantially the same voltage levels as the input signals applied to the different input terminals of the circuit. The output signal appearing at the output terminal 44 has substantially the same levels as the input signals, but is the complement of the input signals in accordance with the logic equation referred to above.

In addition to providing the translation of voltage levels of the output signal, the emitter follower transistors 28 and 142 also serve to minimize the output impedance of the circuits of FIGURES 1 and 3. Therefore, the time constants of any coupling capacitors associated with the output of the circuit are materially reduced. Because of the low output impedance provided by the emitter follower transistor 142, the circuit has a large fan-out capability. That is, the circuits of FIGURES 1 and 3 are capable of driving a large number of logic gates, and the like.

The low output impedance of the emitter followers 28 and 142 also serve to reduce parasitic coupling to ground or to the substrate, when the circuitry is constructed as an integrated circuit.

The inclusion of the bias stabilizing transistor 148 and its associated circuitry provides regulation in the system of FIGURE 3. The bias stabilizing transistor 148 responds to any variations in the source 16 so as to shift the operating point of the circuit of the transistor 100, and of the associated input transistors. This regulation by the circuit of the bias stabilizing transistor 148 renders the system of FIGURE 3 relatively insensitive to variations in the power supply, and also compensates for the temperature characteristics of transistor 100.

It will be appreciated that the direct current characteristics of the half-adder circuit of FIGURE 2 are the same as the characteristics of the circuits of FIGURES 1 and 3. The circuit of the multiple emitter transistor 66 in FIGURE 2 is used, as in the embodiments of FIGURES 1 and 3, to perform an "and" function in a simple manner, and with a minimum of necessary components.

The invention provides, therefore, logic circuitry which is particularly adaptable to integrated circuit constructions. The outstanding feature of the circuitry of the present invention is the use of multiple emitter transistors to perform "and" functions in a simple manner, and with a minimum of required components and circuitry.

The particular circuits described herein are most advantageous in that they are most reliable, and they are insensitive to relatively wide variations in components values, parameter changes and power supply drifts. All these features render the circuits and system of the invention particularly suited for integrated circuit construction.

The logical capabilities of the circuits are extremely high in that the circuits are capable of performing "or" and "nor" functions simultaneously, and in addition, they exhibit high fan-in and fan-out capabilities. Also, a large amount of logical flexibility is possible in the circutry, for the reasons described.

It will be appreciated that while particular embodiments of the invention have been shown and described, modifications may be made, and it is intended in the following claims to cover all such modifications which fall within the scope of the invention.

What is claimed is:

1. Logic circuitry including in combination, first semiconductor means having an input electrode portion, a plurality of common electrode portions and an output electrode portion, a plurality of further semiconductor means each having input, output and common electrode portions; first impedance means coupling said output electrode portion of said first semiconductor means to potential supply means; means including a common degenerative feedback impedance coupled to said common electrode portions of said further semiconductor means and to respective ones of said common electrode portions of said first semiconductor means; means for introducing different input signals to said input electrode portions of respective ones of said further semiconductor means to switch the circuitry between a first state in which said first semiconductor means is conductive and a second state in which said first semiconductor means is non-conductive and in which at least one of said further semiconductor means in each of said groups is conductive; bias circuit means for applying a reference potential to said input electrode portion of said first semiconductor means, said bias circuit means including additional semiconductor means connected to the potential supply means and compensating said reference potential for variations in the potential of the supply means and for variations in temperature, and output circuit means including an emitter follower coupled to said output electrode portion of said first semiconductor means and responsive to the potential across said first impedance means for producing an output signal.

2. Logic circuitry including in combination: first transistor means having a plurality of emitter electrodes, a collector electrode, and a base electrode; a plurality of groups of further transistor means, each of said further transistor means having an emitter electrode, a collector electrode, and a base electrode; first resistance means connecting the collector electrode of said first transistor means to unidirectional exciting potential supply means; means for connecting the collector electrodes of said further transistor means to said unidirectional exciting potential supply means; means including a common degenerative feedback resistor coupling the emitter electrodes of said further transistor means in each of said groups to respective ones of said emitter electrodes of said first transistor means and to a point of reference potential; input circuit means coupled to said base electrodes of said further transistor means for introducing different input signals thereto to switch the circuitry between a first state in which said first transistor means is conductive and a second state in which said first transistor means is non-conductive and in which at least one transistor means in each of said groups is conductive; output circuit means including an emitter follower circuit coupled to said collector electrode of said first transistor means and responsive to the potentials across said first resistance means for producing output signals; and bias circuit means coupled to said base electrode of said first transistor means for applying a threshold voltage thereto, said bias circuit means including voltage divider resistance means connected between said unidirectional potential supply means and said point of reference potential, additional transistor means having a collector connected to said potential supply means, a base connected to an intermediate point on said voltage divider resistance means, and an emitter connected to said base electrode of said first transistor means; and resistance means connected to the base electrode of said first transistor means and to said point of reference potential across which the threshold voltage is developed, said bias circuit means compensating the threshold voltage for variations in the potential of said supply means and for changes in the characteristic of said transistor means with temperature, to thereby compensate the output signals produced in said first and second states.

3. Logic circuitry including in combination: a first transistor having a plurality of emitter electrodes, a collector electrode, and a base electrode; a plurality of further transistors, each of said further transistors having an emitter electrode, a collector electrode, and a base electrode; first resistance means connecting the collector electrode of said first transistor to unidirectional exciting potential supply means; means for connecting the collector electrodes of said further transistors to said unidirectional exciting potential supply means; means including a common degenerative feedback resistor coupling the emitter electrodes of said further transistors to respective ones of said emitter electrodes of said first transistor and to a point of reference potential; input circuit means coupled to said base electrodes of said further transistors for introducing different input signals thereto to switch the circuitry between a first state in which said first transistor is conductive and a second state in which said first transistor is non-conductive and in which at least one transistor in each of said groups is conductive; output circuit means including an emitter follower circuit coupled to the collector electrode of said first transistor and responsive to the potentials across said first resistance means for producing output signals; and bias circuit means coupled to the base electrode of said first transistor for applying a threshold voltage thereto, said bias circuit means including voltage divider resistance means connected between said unidirectional potential supply means and said point of reference potential, an additional transistor having a collector connected to said potential supply means, a base connected to an intermediate point on said voltage divider resistance means, and an emitter connected to the base electrode of said first transistor, and resistance means connected to said base electrode of said first transistor and to said point of reference potential across which the threshold potential is developed, said bias circuit means compensating the threshold voltage for variations in the potential of said supply means and for changes in the characteristic of said first transistor with temperature, to thereby compensate the output signals produced by said first and second states.

4. Logic circuitry including, in combination:
(a) a first transistor having an output electrode, an input electrode, and a plurality of common electrodes,
(b) a plurality of degenerative feedback impedances connected respectively to said common electrodes,
(c) a plurality of input transistors connected respectively to said plurality of degenerative feedback impedances and adapted to receive binary input logic signals, said input transistors operative to conduct current to said plurality of degenerative feedback impedances for developing voltages thereacross capable of changing the conductive state of said first transistor, and
(d) an emitter follower connected to said first transistor for providing an output logic signal in response to binary logic signals applied to said input transistors.

5. Logic circuitry including, in combination:
(a) a multi-emitter transistor having a collector, a base, and a plurality of emitters,
(b) a plurality of degenerative feedback impedances connected respectively to said plurality of emitters,
(c) a plurality of input transistors connected respectively to said plurality of degenerative feedback impedances and connectable to sources of binary input logic signals, said input transistors operative to conduct current to said degenerative feedback impedances for developing voltages at the respective emitters of said multi-emitter transistor capable of changing the conductive state of said multi-emitter transistor, and
(d) output circuit means including an emitter follower connected to said multi-emitter transistor for providing an output logic signal in response to binary input logic signals applied to said input transistors.

6. Logic circuitry including, in combination:
(a) a multi-emitter transistor having a collector, a base, and a plurality of emitters, said multi-emitter transistor connectable to a voltage supply,
(b) a plurality of degenerative feedback impedances connected respectively to said plurality of emitters,
(c) a plurality of input transistors connected respectively to said plurality of degenerative feedback impedances and further connectable to sources of binary input logic signals, said input transistors operative to conduct current to said degenerative feedback impedances for developing a voltage thereacross capable of changing the conductive state of said multi-emitter transistor, (d) output circuit means connected to said multi-emitter transistor for providing output logic signals in response to binary input logic signals applied to said input transistors, and (e) bias stabilizing circuit means connected to said multi-emitter transistor for applying a reference potential thereto and providing compensation for potential variations in said supply voltage and compensation for temperature induced potential variations in the PN junctions of said logic circuitry.

7. Logic circuitry including, in combination:

(a) a multi-emitter transistor having a collector, a base, and a plurality of emitters, said multi-emitter transistor connected via a load resistor to a potential supply means, (b) a plurality of degenerative feedback impedances connected respectively to said plurality of emitters, (c) a plurality of input transistors connected respectively to said plurality of degenerative feedback impedances and further connectable to sources of binary input logic signals, said input transistors operative to conduct current to said degenerative feedback impedances for developing a voltage thereacross capable of changing the conductive state of said multi-emitter transistor, (d) an output emitter follower connected to said multi-emitter transistor for providing output logic signals in response to predetermined patterns of binary input logic signals applied concurrently to said input transistors, and (e) bias stabilizing circuit means including a voltage divider connected between said potential supply means and a point of reference potential, and a bias stabilizing transistor connected between an intermediate point on said voltage divider and said multi-emitter transistor for providing bias stabilization at said multi-emitter transistor and maintaining the DC bias potential thereat at a point half way in the logic swing of input logic signals applied to said binary input transistors and half way in the logic swing of the logic signal at the output of said emitter follower.

8. Logic circuitry including, in combination:

(a) a first transistor having a base, a collector, and multiple emitters, (b) a collector load resistor coupling said collector of said first transistor to potential supply means, (c) a plurality of degenerative feedback resistors connected respectively between said multiple emitters of said multiple emitter transistor and a point of reference potential, (d) a first plurality of input transistors connected in parallel and to one of said plurality of degenerative feedback resistors, (e) a second plurality of input transistors connected in parallel and to another of said plurality of degenerative feedback resistors, said first and second pluralities of parallel connected input transistors connected through first and second collector load resistors respectively to said potential supply means, (f) a first emitter follower transistor connected to said first plurality of parallel connected input transistors and providing one output logical function, (g) a second output emitter follower transistor connected to said second plurality of parallel connected input transistors and providing a carry logical function, and (h) a third output emitter follower transistor connected to said multiple emitter transistor and providing a sum logical function.

9. A majority gate including, in combination:

(a) a multiple emitter transistor having a collector, a base, and a plurality of emitters, (b) a collector load resistor coupling said collector to a potential supply means, (c) first, second, and third pluralities of parallel-connected input transistors adapted to receive binary logic signals, said first, second, and third pluralities of parallel connected input transistors connected respectively to said plurality of emitters of said multiple emitter transistor, each of the emitters of said first, second, and third pluralities of parallel connected input transistors and said emitters of said multiple emitter transistor sharing respectively, separate common degenerative feedback resistors, the feedback resistors connected to a point of reference potential, (d) output circuit means connected to each of said first, second, and third pluralities of parallel connected input transistors for providing collector current to the conducting transistors in said first, second, and third pluralities of input transistors and for developing a first output logical function, and (e) an emitter follower output transistor connected to the collector of said multiple emitter transistor for providing a second output logical function.

10. The majority gate according to claim 9 wherein:

(a) said output circuit means includes first, second, and third transistors connected in parallel between said potential supply means and said point of reference potential, said last-named first, second, and third transistors having their base-to-collector bias resistors connected respectively to the collectors of the transistors in said first, second, and third pluralities of parallel connected input transistors, (b) said majority gate further including a bias stabilizing transistor having a base, an emitter, and a collector, said last named emitter connected to the base of said multiple-emitter transistor, (c) a voltage divider network connected between said potential supply means and said point of reference potential, (d) said bias stabilizing transistor connected to an intermediate point on said voltage divider for biasing said multiple emitter for current mode switching and for desensitizing the loading effects on said multi-emitter transistor.

References Cited

UNITED STATES PATENTS

| | | | |
|---|---|---|---|
| 2,476,323 | 7/1949 | Rack | 307—88.5 |
| 2,666,150 | 1/1954 | Blankely | 307—88.5 |
| 2,769,086 | 10/1956 | Edwards | 328—98 |
| 2,901,638 | 8/1959 | Huang | 307—88.5 |
| 3,016,466 | 1/1962 | Richards | 307—88.5 |
| 3,046,416 | 7/1962 | Case | 307—88.5 |
| 3,217,181 | 11/1965 | Zuk | 307—88.5 |
| 3,229,119 | 1/1966 | Bohn et al. | 307—88.5 |
| 3,233,125 | 2/1966 | Buie | 307—88.5 |

OTHER REFERENCES

"Combining Logical Circuits" by Buelow, Wood and Turnbull. IBM Technical Bulletin vol. 2, No. 2, August 1959, page 48 relied on (copy in Scientific Library and 307-88.5-3.6).

JOHN W. HUCKERT, *Primary Examiner.*

A. J. JAMES, *Assistant Examiner.*